United States Patent [19]

Payne

[11] 4,304,575

[45] Dec. 8, 1981

[54] PREPARATION OF LARGE PARTICLE SILICA SOLS

[75] Inventor: Charles C. Payne, Chicago, Ill.

[73] Assignee: Nalco Chemical Company, Oak Brook, Ill.

[21] Appl. No.: 132,075

[22] Filed: Mar. 20, 1980

[51] Int. Cl.$^3$ ............................ B01J 13/00; C01B 33/141
[52] U.S. Cl. .................................... 51/308; 252/313S; 423/335
[58] Field of Search ................ 252/313 S; 423/335; 51/308

[56] References Cited

U.S. PATENT DOCUMENTS 3,012,973  12/1961  Atkins .............................. 252/313 S
3,538,015  11/1970  Mindick ........................... 252/313 S

FOREIGN PATENT DOCUMENTS 505323  8/1954  Canada ............................ 252/313 S

*Primary Examiner*—Deborah L. Kyle
*Attorney, Agent, or Firm*—Richard L. Johnston; John G. Premo; Robert A. Miller

[57] ABSTRACT

Large particle aqueous silica sols are prepared in a single step by heating an alkaline aqueous silica sol containing smaller silica particles mixed with larger silica particles while maintaining the ratio of the total surface area of the smaller silica particles to the total surface area of the larger silica particles at a predetermined ratio and under conditions such that the smaller silica particles dissolve and redeposit on the larger silica particles thereby producing an aqueous silica sol in which the majority of the silica particles have a size significantly larger than the larger silica particles in the starting mixed sol.

10 Claims, No Drawings

PREPARATION OF LARGE PARTICLE SILICA SOLS

BACKGROUND

It is well known that there is a large body of literature dealing with the preparation of silica sols wherein the silica particles have various diameters and the sols are prepared by many different methods. A list of patents and literature is given on pages 91-100 of Surface and Colloid Science published in 1973 by John Wiley & Sons. Among other things, this publication discloses on pages 12-15 methods of increasing the particle size of the silica particles in silica sols by heating. In one such process disclosed by Rule in U.S. Pat. No. 3,012,972, a sol consisting of particles from 8-15 millimicrons (m$\mu$) in diameter is first thoroughly deionized, and then autoclaved at from 300°-350° C. under autogenous pressures. This is said to produce silica particles in the diameter range from 88 to 150 m$\mu$ which can be concentrated to a stable sol containing over 60% by weight of silica. This process involves the use of an acidic pH during the heating step and an acidic pH tends to produce gels. It also requires the use of deionized water in making the starting sol. The concentration of the sol is effected by boiling or otherwise removing water from the sol produced by the process.

It is known to prepare silica sols containing a majority of large particles in separate steps using starting sols in which the particles are substantially uniform or have a relatively narrow range of size distribution. For example, a silica sol having an average silica particle diameter of 20 millimicrons can be prepared by heating a silica sol having an average silica particle diameter of 15 millimicrons. A silica sol having an average silica particle diameter of 40 millimicrons can be prepared by heating a silica sol having an average silica particle diameter of 20 millimicrons. A silica sol having an average silica particle diameter of 60 millimicrons can be prepared by heating a silica sol having an average silica particle size diameter of 40 millimicrons. However, this preparation of silica sols containing silica particles having an average diameter of 60 millimicrons requires three separate distillations. Moreover, in this type of preparation the particle formation occurs primarily by the same sized particles condensing with one another.

It would be desirable to prepare silica sols containing large sized silica particles in a single step and this is the primary object of the present invention.

Another object of the invention is to provide a method of preparing silica sols containing silica particles of larger sizes which have not heretofore been available and have not been prepared by conventional methods, and especially new and improved silica sols in mono-dispersed form wherein the majority, if not practically all of the silica particles have large diameters so that the resultant sols are especially useful as abrasive materials in mechanically polishing semi-conductor wafers such as silicon, sapphire, and gadolinium-gallium-garnets (GGG wafers).

BRIEF SUMMARY OF THE INVENTION

In accordance with the invention large particle aqueous silica sols are prepared in a single step by heating an alkaline aqueous silica sol containing smaller silica particles mixed with larger silica particles while maintaining the ratio of the total surface area of the smaller silica particles to the total surface area of the larger silica particles at a predetermined ratio and under conditions such that the smaller silica particles dissolve and redeposit on the larger silica particles thereby producing an aqueous silica sol in which the majority of the silica particles have a size significantly larger than the larger silica particles in the starting mixed sol.

DETAILED DESCRIPTION OF THE INVENTION

In making large particle silica sols, three competing rates of action are involved, namely:
1. rate of particle formation;
2. rate of deposition on existing particles; and
3. rate of dissolution of existing particles.

The present invention is based upon the concept that first of all there must be a sufficient number of large particles in the silica sol, secondly, there should be no excess soluble silica, and thirdly, high temperatures must be used. If there are too many small particles, they will tend to form new particles with one another. If the number of large particles and the corresponding surface area is too small to accept the soluble silica being added to the existing particles, the smaller particles will tend to form new particles with one another. Therefore, the invention is based upon the discovery that by maintaining a predetermined ratio of the total surface area of the smaller particles to the total surface area of the larger particles and operating under certain conditions of pH, temperature and pressure, it is possible to provide a process in which the smaller silica particles dissolve and redeposit on the larger silica particles without forming new particles with one another. The predetermined ratio of total surface area of the smaller silica particles to the total surface area of the larger silica particles can be determined from the following equation:

$$\frac{PD_f}{PD_o} = \left(\frac{C_f}{C_o}\right)$$

where:
PD$_f$=final Particle Diameter
PD$_o$=initial Particle Diameter
C$_f$=final Concentration of SiO$_2$
C$_o$=initial Concentration of SiO$_2$
and the equation for surface area based upon experimental results $$SA = \frac{3000}{PD}$$

SA=Surface Area
PD=Particle Diameter
The following equation is used to determine the weight percent of 15 m$\mu$ to be used $$\text{Wt \% of 15 m}\mu \text{ to be used} = \frac{600\ SA_L}{6\ SA_L + SA_S} \qquad \text{(Equation 1)}$$

where:
SA$_L$=surface area of the large particle
SA$_S$=surface area of the small particle
Thus, for a mixture of 165 m$\mu$ and 15 m$\mu$ particles:

$$SA_L = \frac{3000}{165} = 18.2\ m^2/gm$$

$$SA_S = \frac{3000}{15} = 200 \text{ m}^2/\text{gm}$$

Calculation of equation 1 gives 35.6% of 15 mµ sol. Therefore, a mixture of 64.4% 165 mµ sol and 35.6% 15 mµ sol gives the desired ratio of surface areas.

The solubility of amorphous silica with particle size is given by the equilibrium $$S \rightleftharpoons S_R$$

where:
S = the solubility of a large particle
$S_R$ = the solubility of a small particle of radius R.

The solubility will vary with particle size by a modified Ostwald-Freudlich equation first derived by Gibbs in 1876. The equation was further modified by Dundon and Mach, J.Am. Chem. Soc., 45, 2479 (1923), and is given as follows:

$$\ln \frac{S_R}{S} = \frac{2EV}{RTr} \quad (\text{"ln"} = \text{natural logarithm})$$

where:
E = the interfacial surface energy of amorphous silica in contact with water and is equal to the surface energy of amorphous silica minus the energy of wetting the anhyrous amorphous surface.
V = Molar Volume (29 cc)
r = Radius of particle
R = gas constant $8.31 \times 10^7$ ergs/mole-deg
T = Absolute Temperature From the equation, elevation of temperature will produce a small ratio of $S_R/S$. This is interpreted as a shift in the equilibrium from small particle $S_R$ to the larger particle S.

The following table (Table I) in which the percentages given are $SiO_2$ particles by weight illustrates the average $SiO_2$ particle diameter of various aqueous silica sols which can be employed as starting materials for the practice of the invention.

TABLE I

| | |
|---|---|
| A | 30% silica sol, pH = 10.0 average particle diameter of 8 mµ |
| B | 40% silica sol, pH = 9.7 average particle diameter of 15 mµ. |
| C | 50% silica sol, pH = 9.0 average particle diameter of 20 mµ. |
| D | 50% silica sol, pH = 10.0 average particle diameter of 40 mµ. |
| E | 50% silica sol, pH = 8.5 average particle diameter of 60 mµ. |
| F | 26% silica sol, pH = 8.5 average particle diameter of 124 mµ. |

TABLE II

The following table (Table II) illustrates the properties of various silica sols in which the silica particles have average particle diameters of 40 mµ or less and therefore are characterized as smaller silica particles for the purpose of this invention.

| | % $SiO_2$ | pH | Average Particle Diameter | Surface Area (m²/gm) | No. of* Particles per Unit Weight | Ratio of Smaller PD Surface Area to E sol Table I Surface Area |
|---|---|---|---|---|---|---|
| A | 30% | 10.0 | 8 | 375 | 125 | 425 |
| B | 40% | 9.7 | 15 | 200 | 19 | 64 |
| C | 50% | 9.0 | 20 | 150 | 8 | 27 |
| D | 50% | 10.0 | 40 | 75 | 1 | 3.4 |

*D given the value of 1

The pH of the mixed silica sols employed as starting materials is usually within the range of 8.5 to 10.5 and preferably the sol mixture has a pH within the range of 9.0 to 10.5. Depending upon the temperature used, too high a pH can result in dissolution of the silica particles without redeposition of the smaller particles on the larger particles.

The temperature employed is preferably within the range of 138° C. to 240° C. Too high a temperature, say 316° C. (600° F.) for five hours at pH 10.2 using a mixture of an 8 mµ sol and 60 mµ sol under autogenous pressure caused complete conversion of the silica to a crystalline type silica.

The pressures employed in the process should be super-atmospheric pressures sufficiently high to maintain the liquid state under the temperature conditions employed. The process is preferably carried out in a closed vessel under autogenous pressure produced by the temperature conditions used, e.g., 50–475 psig.

The concentration of the $SiO_2$ content in the starting mixed sol is preferably within the range of 5% to 50% by weight and good results have been obtained using a starting mixed sol in which the $SiO_2$ content is approximately 10% by weight.

The time of heating can be determined empirically depending upon the temperatures used and will usually be within the range of 1 to 5 hours.

The invention will be further illustrated but is not limited by the following examples in which the quantities are by weight unless otherwise indicated.

EXAMPLE I

The process was carried out in a one liter stainless steel autoclave equipped with stirring and cooling coils and means for monitoring the temperature.

An initial preparation was made using as a starting material an aqueous mixed sol of which 5% by weight of the silica was derived from sol E and 5% by weight of the silica was derived from sol A. The initial pH was 10.2 and the mixed sol was heated at 450° F. (232° C.) for 5 hours. The results indicated that the dissolution rate was too fast and the excess soluble silica could not deposit on the larger particles fast enough.

The final product contained a majority of larger particles but also contained a number of particles fused together because of the excess soluble silica which could not deposit onto the larger particles fast enough.

EXAMPLE II

The procedure was the same as in Example I except that the smaller particles were obtained by using silica sol C in which the average particle diameter was 20 mµ rather than 8 mµ as in Example I. Otherwise the conditions employed were the same. The majority of the silica particles in the resultant sol were within the particle range of 80 to 130 mμ with relatively few smaller silica particles having an average diameter of 40 mμ or less.

The results of the preparations in Examples I and II indicate that a particle size between 8 mμ and 20 mμ gives the optimum dissolution rate (no small particles remaining after 5 hours of heating) to optimum deposition rate (on 60 mμ particles).

EXAMPLE III

The procedure was the same as in Example I except that the mixed sol was prepared from a sol containing silica particles having an average diameter of 100 mμ (the larger particles) and a silica sol in which the silica particles had an average diameter of 15 mμ. The starting pH was 10.3. The mixed sol was heated for 5 hours at 450° F. (232° C.). The resultant product had large particles which ranged from 115 mμ to 142 mμ with the majority of the particles around 125 mμ. There were a number of particles with diameters of about 60 mμ.

EXAMPLE IV

The previous preparations using silica sol B indicated that if the surface area ratio of small particles to large particles exceeded 6:1, small particles would be present in the final product. Consequently, in the next preparation the proportion by weight of the silica was modified to 5.5% of the 125 mμ product prepared as described in Example III and 4.5% of the 15 mμ product (sol B in Tables I and II. The temperature and time of heating was 450° F. for 5 hours. The final product had large particles from 116 mμ to 163 mμ with the majority of the particles of around 160 mμ. The few small particles from the previous run had grown to approximately 80 mμ.

EXAMPLE V

Calculations showed that a 6.5% by weight silica of the 160 mμ sol, plus 3.5% by weight silica of the 15% mμ silica sol would maintain a surface area ratio of 6:1, i.e., the ratio of the total surface area of the small particles to the total surface area of the large particles in the mixed sol.

This mixed sol which had a pH of 10.2 when heated at 450° F. for 5 hours gave a final product with large particles in the 170 mμ to 190 mμ range and with the majority of the particles of around 180 mμ. There were also a number of fused particles present and small particles around 80 mμ. On the whole, however, the sol was essentially a mono-dispersed sol consisting essentially of large sized particles with only an insignificant number of smaller particles around 80 mμ in size.

From the results obtained it seemed evident that the process could be employed to prepare aqueous silica sols with the majority of the particles having an average diameter of at least 160 mμ and within the range of 160 to 300 mμ with the possibility of obtaining silica sols in which the majority of the silica particles had an average size of 500 mμ and with only a minimum amount less than 20% by weight of silica particles having average diameters of 40 mμ or less.

The preferred embodiment of the invention is the preparation of silica sols with an average diameter of 180 mμ by first heating a mixture of a large particle silica sol in which the average diameter of the silica particles is 60 mμ and a smaller particle silica sol in which the average diameter of the silica particles is 15 mμ for 5 hours at 450° F. and a pH of 10.2. The preparation proceeds batchwise with bimodal mixtures of the corresponding larger particles sized sols and the smaller particle sized sols at such a ratio that the surface area of the small to large particles does not exceed 6:1. The equation for determining the percentage of small particles needed is applicable only to the 15 mμ sol at 450° F. and 5 hours heating time. Smaller particle sized silica sols require lower heating times and temperatures to obtain the proper rate of dissolution or prevent new particle formation with one another.

It will be apparent that there can be some variation and modification in the practice of the invention especially with respect to pH, temperature, time of heating and pressure, depending upon the particle sizes of the smaller and larger silica particles but always maintaining a predetermined ratio of the total surface area of the smaller particles to the larger particles corresponding to a ratio such that under the conditions used to pH will not be high enough to dissolve all of the particles and the rate of dissolution of the smaller particles will be such that the smaller particles will dissolve and redeposit on the larger particles rather than combine with one another to produce intermediate sized particles. The ratio of the total surface areas of the smaller particles to the larger particles is, therefore, quite important.

The silica sols containing large sized silica particles prepared in accordance with the process described herein are especially useful as abrasive materials and particularly in mechanically polishing semi-conductor wafers such as silicon, sapphire, and gadolinium-gallium-garnets (GGG wafers).

I claim:

1. A process of preparing large particle aqueous silica sols suitable for use as abrasive materials in mechanically polishing semi-conductor wafers which comprises heating an alkaline aqueous silica sol containing smaller silica particles having an average diameter not more than approximately 40 millimicrons mixed with larger silica particles having an average diameter of at least approximately 60 millimicrons while maintaining a predetermined ratio of the total surface area of the smaller silica particles to the total surface area of the larger silica particles and conditions of pH, temperature, and pressure such that the smaller silica particles dissolve and redeposit on the larger silica particles to produce in a single step an aqueous silica sol in which the majority of the silica particles have a size substantially larger than the larger silica particles in the starting mixed sol.

2. A process as claimed in claim 1 in which said predetermined ratio does not exceed 6:1, the heating is carried out under superatmospheric pressure sufficient to maintain the liquid state, at a pH within the range of 9.0 to 10.5, and a temperature within the range of 138° C. to 240° C.

3. A process as claimed in claim 2 in which the heating is carried out at a temperature of approximately 232° C. for 5 hours at a pH of approximately 10.2.

4. A silica sol resulting from the process of claim 2.

5. A process as claimed in claim 1 in which the heating is carried out in a closed vessel under the autogenous pressure produced by the temperature conditions used.

6. A process as claimed in claim 1 in which the $SiO_2$ content of the starting sol is within the range of 5% to 50% by weight.

7. A process as claimed in claim 1 in which the SiO$_2$ content of the starting sol is approximately 10% by weight.

8. A process as claimed in claim 1 in which the smaller silica particles have an average diameter of approximately 15 millimicrons and the larger silica particles have an average diameter of approximately 160–165 millimicrons, the large particles in the resultant sol having a diameter within the range of 170–190 millimicrons with the majority of the particles around 180 millimicrons.

9. A silica sol resulting from the process of claim 8.

10. A silica sol resulting from the process of claim 1.

* * * * *

UNITED STATES PATENT AND TRADEMARK OFFICE
CERTIFICATE OF CORRECTION

PATENT NO. : 4,304,575
DATED : December 8, 1981
INVENTOR(S) : CHARLES C. PAYNE

It is certified that error appears in the above-identified patent and that said Letters Patent are hereby corrected as shown below:

[57] ABSTRACT, line 2, "slica" should read --silica--.

Column 2, in the equation after line 35, change the equation to read:

$$-- \frac{PD_f}{PD_o} = \left(\frac{C_f}{C_o}\right)^{1/3} --.$$

Signed and Sealed this

Twenty-third Day of March 1982

[SEAL]

Attest:

Attesting Officer

GERALD J. MOSSINGHOFF
Commissioner of Patents and Trademarks